(12) United States Patent
Amano et al.

(10) Patent No.: US 6,934,184 B2
(45) Date of Patent: *Aug. 23, 2005

(54) MAGNETIC MEMORY

(75) Inventors: Minoru Amano, Kanagawa-Ken (JP);
Tatsuya Kishi, Kanagawa-Ken (JP);
Hiroaki Yoda, Kanagawa-Ken (JP);
Yoshiaki Saito, Kanagawa-Ken (JP);
Shigeki Takahashi, Kanagawa-Ken (JP); Tomomasa Ueda, Kanagawa-Ken (JP); Katsuya Nishiyama, Kanagawa-Ken (JP); Yoshiaki Asao, Kanagawa-Ken (JP); Yoshihisa Iwata, Kanagawa-Ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 23 days.

This patent is subject to a terminal disclaimer.

(21) Appl. No.: 10/893,915

(22) Filed: Jul. 20, 2004

(65) Prior Publication Data

US 2004/0257866 A1 Dec. 23, 2004

Related U.S. Application Data

(63) Continuation of application No. 10/329,417, filed on Dec. 27, 2002, now Pat. No. 6,831,857.

(30) Foreign Application Priority Data

Dec. 28, 2001 (JP) .......................................... 2001-400049

(51) Int. Cl.$^7$ .............................................. G11C 11/15
(52) U.S. Cl. ........................ 365/173; 365/157; 365/158
(58) Field of Search ................................ 365/173, 158, 365/157

(56) References Cited

U.S. PATENT DOCUMENTS

| 6,072,718 | A | * | 6/2000 | Abraham et al. |
| 6,211,090 | B1 | * | 4/2001 | Durlam et al. |
| 6,510,080 | B1 | * | 1/2003 | Farrar |
| 6,643,168 | B2 | * | 11/2003 | Okazawa |
| 6,653,703 | B2 | * | 11/2003 | Hosotani et al. |
| 6,683,802 | B2 | * | 1/2004 | Katoh |

* cited by examiner

*Primary Examiner*—Richard Elms
*Assistant Examiner*—Hien Nguyen
(74) *Attorney, Agent, or Firm*—Oblon, Spivak, McClelland, Maier & Neustadt, P.C.

(57) ABSTRACT

A highly reliable magnetic memory exhibits enhanced data-holding stability at high storage density in a storage layer of a magnetoresistive effect element used for memory cells. A magnetic memory includes a memory cell array having first wirings, second wirings intersecting the first wirings and memory cells each provided at an intersection area of the corresponding first and second wirings. Each memory cell is selected when the corresponding first and second wirings are selected. Each memory cell includes a magnetoresistive effect element having a storage layer in which data is stored by magnetic fields generated when current flows the selected first and second wirings, a first magnetic member, having two ends, provided as partially surrounding each first wiring and the two ends being situated in a direction of easy axis of magnetization, to form a closed-loop magnetic circuitry with the storage layer, and a second magnetic member, having two ends, provided as partially surrounding each second wiring and the two ends being situated in a direction of hard axis of magnetization, to amplify magnetic fields applied to the storage layer in the direction of hard axis of magnetization. Each end of the first magnetic member is situated as closer than each end of the second magnetic member to the storage layer.

27 Claims, 6 Drawing Sheets

MAGNETIC MEMORY

CROSS REFERENCE TO RELATED APPLICATIONS

This application is a continuation application of U.S. application Ser. No. 10/329,417 filed Dec. 27, 2002 now U.S. Pat. No. 6,831,857, and base upon and claims the benefit of priority under 35 U.S.C. §119 to Japanese Patent Application No. 2001-400049, filed Dec. 28, 2001, the entire contents each of which are incorporated herein by reference.

BACKGROUND OF THE INVENTION

The present invention relates to a magnetic memory having magnetoresistive effect elements as memory cells.

Magnetic random-access memories (MRAMs) have magnetoresistive effect elements, exhibiting magnetoresistive effect, as memory cells for data storage. MRAMs have attracted attention as a next-generation memory for high-speed operability, large volume and non-volatility.

A magnetoresistive effect is a phenomenon in which the electrical resistance of a ferromagnetic material will vary while magnetic fields are being applied thereto, which depends on the orientation of magnetization in the ferromagnetic material.

MRAMs use this phenomenon for data storage in which data are stored as the orientation of magnetization in a ferromagnetic material and retrieved as change in electrical resistance of the ferromagnetic material.

A recent advanced ferromagnetic tunnel-junction structure having an insulating (tunnel-barrier) layer between two ferromagnetic layers exhibits 20% or more of magnetoresistance ratio (MR ratio) because of a tunnel magnetoresistive (TMR) effect (J. Appl. Phys., 79, 4724 in 1996). This advancement is the trigger for expectation and remark of MRAMs using a ferromagnetic tunnel-junction element based on the TMR effect.

In use of a TMR element for MRAMs, a magnetization-fixed layer, one of the two ferromagnetic layers, having a tunnel-barrier layer therebetween, in which magnetization is fixed, is used as a magnetization-reference layer whereas a magnetization-free layer, the other layer, in which the direction of magnetization can be easily inversed, is used as a storage layer.

Parallel magnetization and antiparallel magnetization between the magnetization-fixed and -free layers can be stored as data in the form of binary data "0" and "1", respectively.

Data is written (stored) with inversed magnetization direction in the storage layer by means of magnetic fields induced by currents flowing wirings for writing provided near the TMR element. The written data is retrieved by detection of change in resistance based on the TMR effect.

The magnetization direction in the magnetization-reference layer is fixed by exchange coupling generated between the ferromagnetic layer and an antiferromagnetic layer provided as touching the former layer so that inversion of the magnetization direction rarely occurs. This structure is called a spin-valve structure.

The magnetization direction in the magnetization-reference layer in this structure is fixed by annealing with application of magnetic fields (magnetization-fixing annealing).

The direction of easy axis of magnetization in the storage layer is affected by given magnetic anisotropy so that it is almost the same direction as in the magnetization-reference layer.

Current-induced magnetic fields cause magnetic rotation in the storage layer, as discussed. It is preferable that the magnetic fields required for inversion of the magnetization direction in the storage layer is small. Easy occurrence of the inversion of magnetization direction, however, could cause malfunctions due to external noise magnetic fields or leak magnetic fields generated during writing in a memory cell adjacent to a target memory cell.

It is thus preferable for the storage layer that the inversion of the magnetization direction easily occurs not in a data-holding state but only in a data-writing state.

Small magnetic fields for the inversion of the magnetization direction is achieved with a soft magnetic material exhibiting small coercivity for the storage layer or a thin storage layer also exhibiting small coercivity.

A stable data-holding state is achieved with high shape anisotropy which is given by high ratio of long to short sides in storage cells of a TMR element.

The smallness in memory cells for high storage density is a preferable choice for high storage capacity in MRAMs. The shorter the short side (called cell width) and also the long side (called cell length) under the design rule, the more feasible for storage density.

Such a small cell structure, however, could have an aspect ratio (a ratio of cell length to cell width) of almost 1, which results in low shape magnetic anisotropy and hence very unstable magnetization in a data-holding state.

SUMMARY OF THE INVENTION

A purpose of embodiments according to the present invention is to provide a highly reliable magnetic memory exhibiting enhanced data-holding stability at high storage density in a storage layer of a magnetoresistive effect element used for memory cells.

A first aspect of the present invention provides a magnetic memory comprising: a memory cell array having a plurality of first wirings, a plurality of second wirings intersecting the first wirings and a plurality of memory cells each provided at an intersection area of the corresponding first and second wirings, each memory cell being to be selected when the corresponding first and second wirings are selected, each memory cell including: a magnetoresistive effect element having a storage layer in which data is stored by magnetic fields generated when current flows the selected first and second wirings; a first magnetic member partially surrounding each first wiring and having two ends, the two ends being situated in a direction of easy axis of magnetization of the storage layer to form a closed-loop magnetic circuitry with the storage layer; and a second magnetic member partially surrounding each second wiring and having two ends, the two ends being situated in a direction of hard axis of magnetization of the storage layer to amplify magnetic fields applied to the storage layer in the direction of hard axis of magnetization, each end of the first magnetic member being closer to the storage layer than each end of the second magnetic member.

Furthermore, a second aspect of the present invention provides a magnetic memory comprising: a memory cell array having a plurality of first wirings, a plurality of second wirings intersecting the first wirings and a plurality of memory cells each provided at an intersection area of the corresponding first and second wirings, each memory cell being to be selected when the corresponding first and second wirings are selected, each memory cell including: a magnetoresistive effect element having a storage layer in which data is stored by magnetic fields generated when current flows the selected first and second wirings; a first magnetic member partially surrounding each first wiring and having two ends, the two ends being situated in a direction of easy axis of magnetization of the storage layer to form a closed-loop magnetic circuitry with the storage layer; and a second magnetic member partially surrounding each second wiring and having two ends, the two ends being situated in a direction of hard axis of magnetization of the storage layer to amplify magnetic fields applied to the storage layer in the direction of hard axis of magnetization, the first magnetic member being made of a material exhibiting permeability higher than the second magnetic memory.

Moreover, a third aspect of the present invention provides a magnetic memory comprising: a memory cell array having a plurality of first wirings, a plurality of second wirings intersecting the first wirings and a plurality of memory cells each provided at an intersection area of the corresponding first and second wirings, each memory cell being to be selected when the corresponding first and second wirings are selected, each memory cell including: a magnetoresistive effect element having a storage layer in which data is stored by magnetic fields generated when current flows the selected first and second wirings; a first magnetic member partially surrounding each first wiring and having two ends, the two ends being situated in a direction of easy axis of magnetization of the storage layer to form a closed-loop magnetic circuitry with the storage layer; and a second magnetic member partially surrounding each second wiring and having two ends, the two ends being situated in a direction of hard axis of magnetization of the storage layer to amplify magnetic fields applied to the storage layer in the direction of hard axis of magnetization, each of the first and second magnetic members being made of a material containing a ferromagnetic material, the two ends of the first magnetic member being elongated, on both sides of the first wiring, toward the storage layer of the magnetoresistive effect element, thus the elongated two ends of the first magnetic member being situated closer to the storage layer than the two ends of the second magnetic member.

DETAILED DESCRIPTION OF EMBODIMENTS

Embodiments according to the present invention will be disclosed with reference to the attached drawings.

(First Embodiment)

Figure 1:
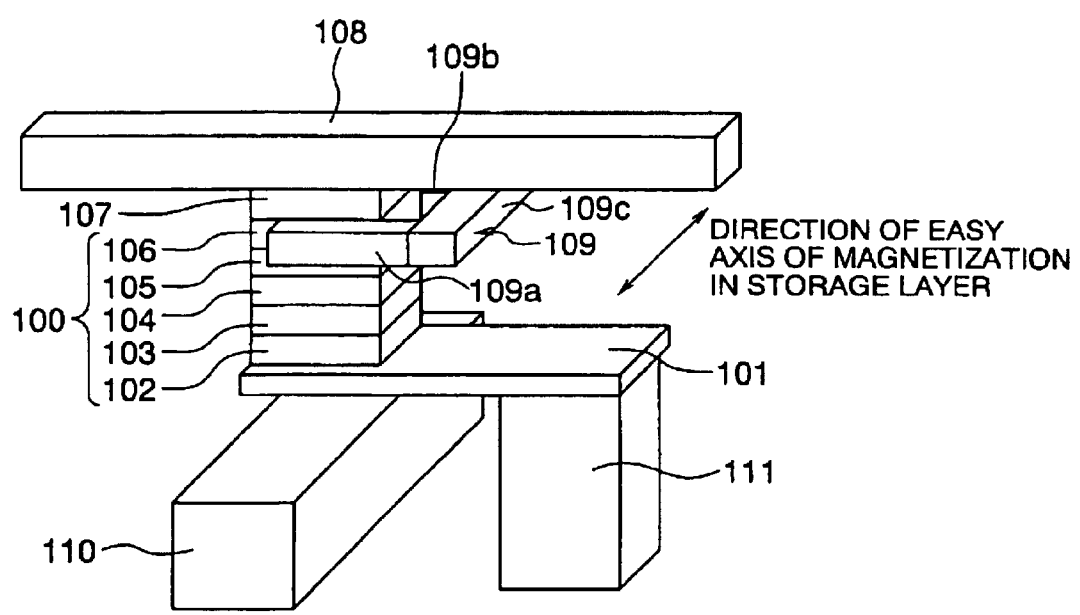
FIG. 1 shows a perspective view indicating a schematic memory-cell structure in a magnetic memory according to a first embodiment of the present invention.

Disclosed with reference to FIG. 1 is a magnetic memory according to the first embodiment of the present invention.

The magnetic memory according to this embodiment is equipped with a memory-cell array having several memory cells arranged in a matrix, several bit lines (wirings) 108 for writing and several word lines (wirings) 110 also for writing intersecting the bit lines 108. The bit and word lines for writing are called write bit lines and write word lines, respectively, hereinafter.

No selection transistors are shown in FIG. 1, a perspective view indicating a schematic memory-cell structure in the magnetic memory according to the first embodiment.

As shown in FIG. 1, each memory cell is provided in the area in which a write bit line 108 and a write word line 110 are intersecting. The memory cell is equipped with a TMR element 100; a lower electrode 101 electrically connected to one of two terminals of the TMR element 100; an upper electrode (or a contact) 107 electrically connected to the other terminal of the TMR element 100; a quasi-semicircular (magnetic) member 109; and a contact plug 111, one of terminals thereof being connected to the lower electrode 101 and the other terminal thereof being connected to the corresponding selection transistor (not shown).

A target storage cell is selected and data is written in the TMR element of this storage cell through the corresponding write bit and word lines 108 and 110.

Each write bit line 108 is electrically connected to the corresponding upper electrode 107 whereas each write word line 110 is electrically isolated from the corresponding lower electrode 101 via an insulating film (not shown).

The TMR element 100 is equipped with a Ta-made buffer layer 102, an Ir—Mn-made antiferromagnetic layer 103, a Co—Fe-made magnetization-reference layer 104, an $Al_2O_3$-made tunnel-barrier layer 105 and a Co—Fe—Ni-made storage layer 106.

The buffer layer 102 is electrically connected to the lower electrode 101. The storage layer 106 is electrically connected to the corresponding write bit line 108 via the upper electrode 107.

The direction of easy axis of magnetization in the storage layer 106 will be almost parallel to the magnetization direction in the magnetization-reference layer 104. This magnetization-axis setting offers the TMR element 100 the maximum MR ratio in the magnetic memory according to the first embodiment.

The TMR element 100 is covered with an insulating film (not shown) and partially surrounded by the quasi-semicircular member 109. The member 109 is a cut-away member made of a highly permeable magnetic material, such as, $Ni_{78}Fe_{22}$. In detail, the member 109 is made of a material containing a ferromagnetic material, which is an alloy including at least one of the metals Co, Fe and Ni, exhibiting specific permeability of more than 10.

The quasi-semicircular member 109 is provided as its both ends having cut-away sections are situated along the direction of easy axis of magnetization, depicted by an arrow in FIG. 1.

This arrangement forms a closed-loop magnetic circuitry in which magnetic fluxes emitted from the storage layer 106 will converge in the quasi-semicircular member 109 from one end thereof and return to the layer 106 from the other end of the member 109.

The closed-loop magnetic circuitry allows decrease in magnetic anisotropic energy in the direction of easy axis of magnetization and thus provides stable magnetization direction in the storage layer 106.

Several modifications to the quasi-semicircular member 109 for its cross section are shown in FIGS. 2A to 2D.

Figure 2A:
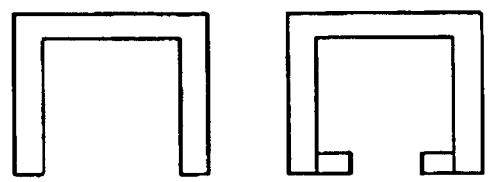
FIG. 2A shows an angled "C"-shaped member and a similar shape member with its ends elongating inside.
Figure 2B:
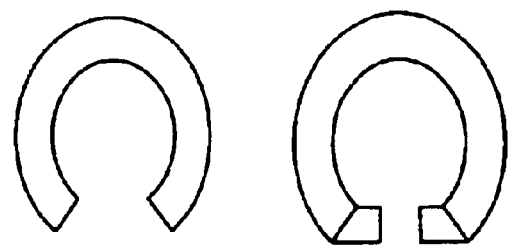
FIG. 2B shows a horseshoe-like member and a similar shape member with its ends elongating inside.
Figure 2C:
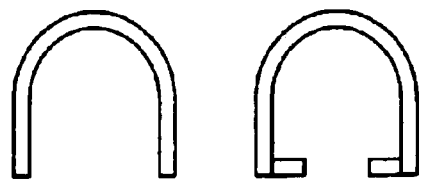
FIG. 2C shows a character-"U"-like member and a similar shape member with its ends elongating inside.
Figure 2D:
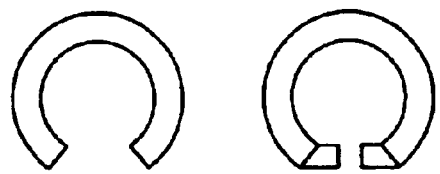
FIG. 2D shows a character-"C"-like member and a similar shape member with its ends elongating inside.

Shown in FIG. 2A are an angled "C"-shaped member and a similar shape member with its ends elongating inside. Shown in FIG. 2B are a horseshoe-like member and a similar shape member with its ends elongating inside. Shown in FIG. 2C are a character-"U"-like member and a similar shape member with its ends elongating inside. Moreover, shown in FIG. 2D are a character-"C"-like member and a similar shape member with its ends elongating inside.

The quasi-semicircular member 109 consists of sub-members 109a and 109b for receiving and sending magnetic fluxes from and to the storage layer 106 and a sub-member 109c for coupling the sub-members 109a and 109b. The member 109 may be an integral structure of these sub-members 109a, 109b and 109c.

The quasi-semicircular member 109 in this embodiment offers stable magnetization direction in the storage layer 106, thus allowing a square memory cell, for example, of 0.15 μm in cell width and length.

The first embodiment thus achieves the specific shape of memory cell having 1 in aspect ratio of cell width to cell length, which has conventionally been considered as unstable.

Figure 3A:
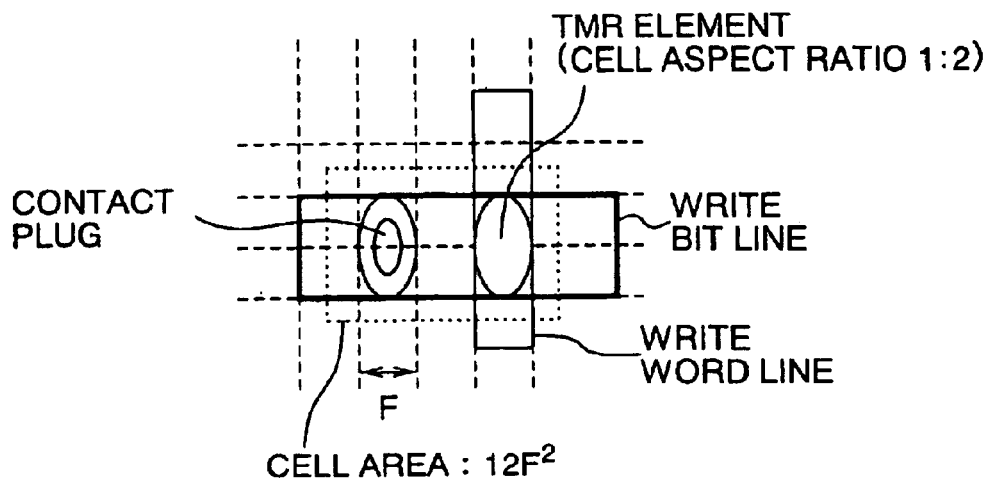
FIG. 3A shows a plan view of a known memory cell.

As shown in FIG. 3A, a known stable TMR element 109 has an aspect ratio of about 2, which inevitably provides a memory cell of 12 $F^2$ in cell area ("F" being a dimension determined under the design rule).

Figure 3B:
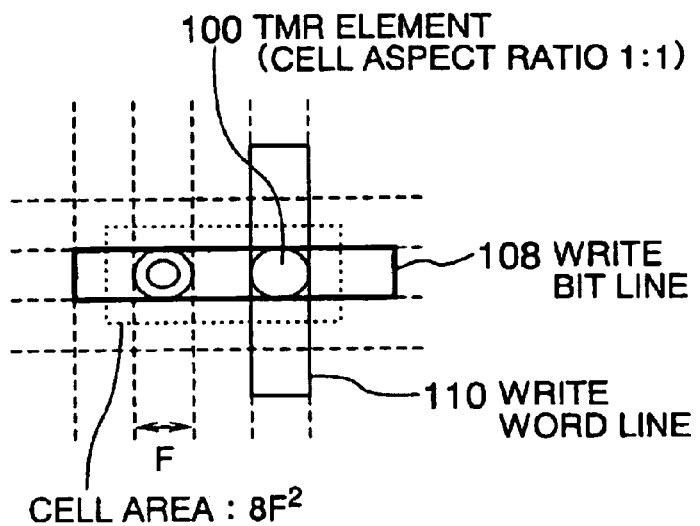
FIG. 3B shows a plan view of a memory cell according to the present invention.

On the contrary, as shown in FIG. 3B, the first embodiment offers 8 $F^2$ in memory cell area, which is reduction of ⅔ from the known the TMR element, thus achieving high storage density.

As disclosed above, the first embodiment offers enhanced data-holding stability in the storage layer of a TMR element used for memory cells, and thus providing a highly reliable magnetic memory.

The quasi-semicircular member 109 in the first embodiment is formed along the film surface of the laminated films of the TMR element 100.

Figure 4:
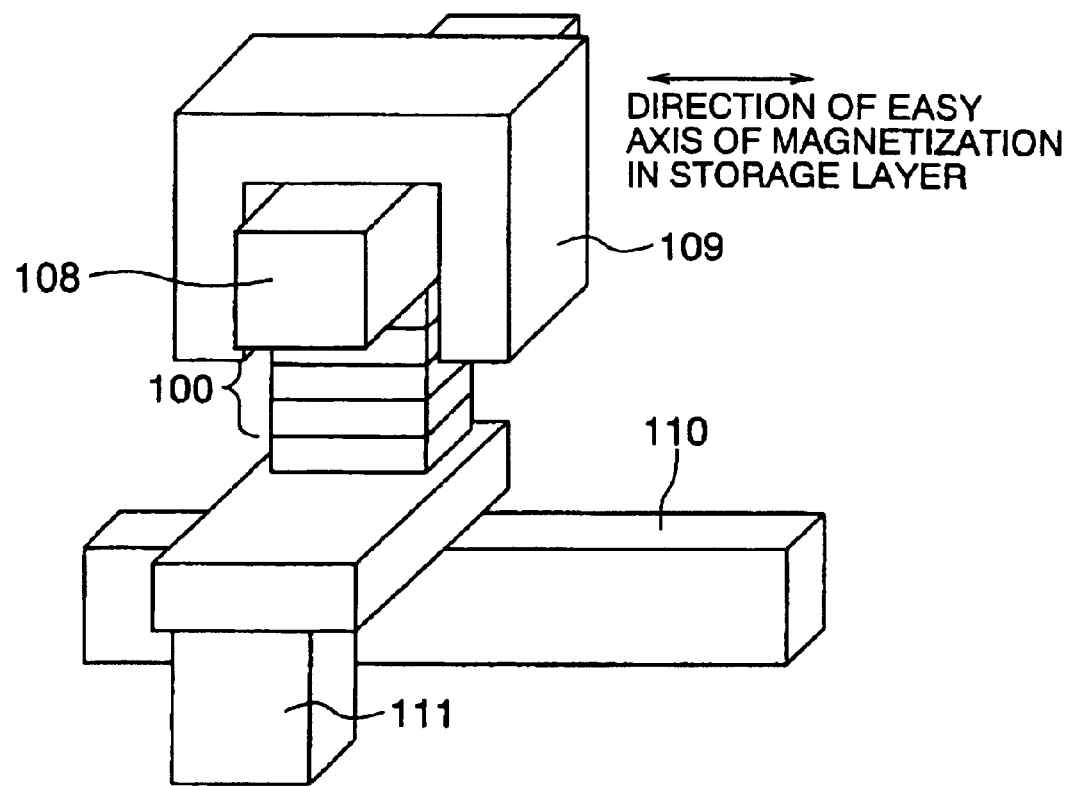
FIG. 4 shows a perspective view indicating a schematic memory-cell structure in a magnetic memory according to a modification to the first embodiment.

Not only that, however, as shown in FIG. 4, the quasi-semicircular member 109 may be formed as being perpendicular to the film surface of the laminated films of the TMR element 100, with the write bit line 108 passing through the member 109.

In the magnetic memory shown in FIG. 4, magnetic fields applied from the two write wirings 108 and 110 cause inversion of magnetization direction in the storage layer 106. The applied magnetic fields then amplify magnetism generated from the wiring 108, which assists in the inversion of the magnetization direction in the storage layer 106.

(Second Embodiment)

Figure 5A:
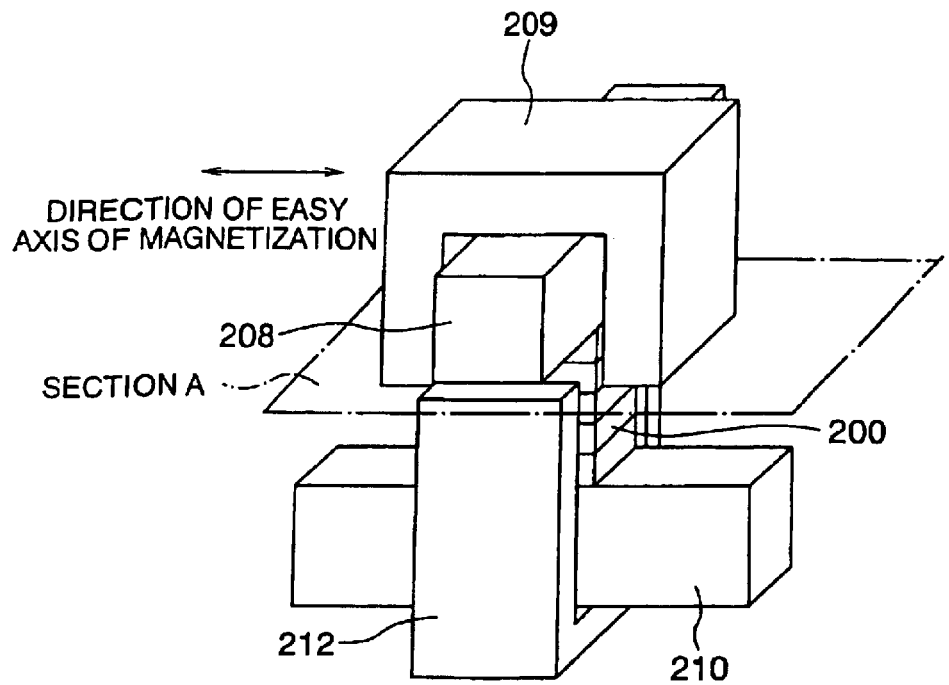
FIG. 5A shows a perspective view indicating a schematic memory-cell structure in a magnetic memory according to a second embodiment of the present invention.
Figure 5B:
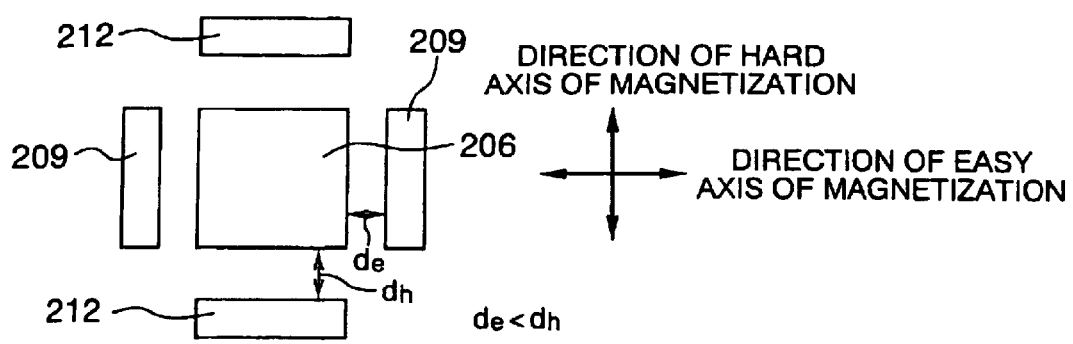
FIG. 5B shows a sectional view taken on section A of FIG. 5A.
Figure 6:
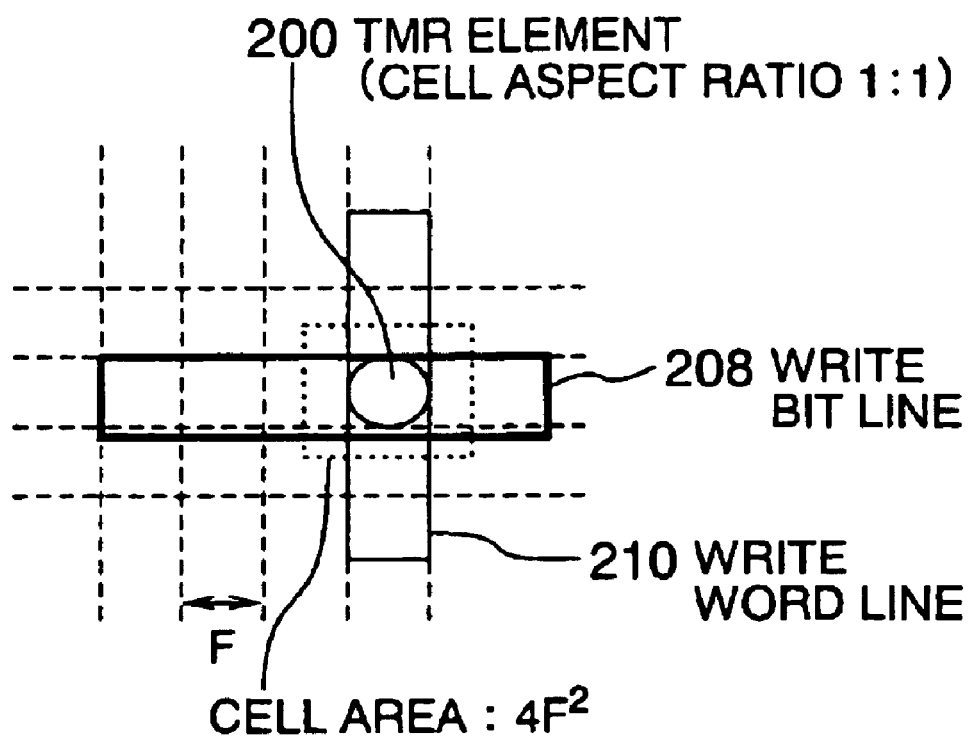
FIG. 6 is a plan view indicating the memory-cell structure according to the second embodiment.

Disclosed with reference to FIGS. 5A, 5B and 6 is a magnetic memory according to the second embodiment of the present invention.

This magnetic memory according to this embodiment is equipped with a memory-cell array of several memory cells arranged in a matrix. Each memory cell has a TMR element and a selection transistor.

FIG. 5A is a perspective view indicating a schematic memory-cell structure in the magnetic memory according to the second embodiment. FIG. 5B is a sectional view taken on section A of FIG. 5A.

In addition to the matrix memory cells, the magnetic memory in this embodiment is equipped with several write bit lines (wirings) 208 and also several write word lines (wirings) 210.

As shown in FIG. 5A, each memory cell is provided in the area in which a write bit line 208 and a write word line 210 are intersecting. The memory cell is equipped with a TMR element 200, a quasi-semicircular (magnetic) member 209 and an inversion-assist (magnetic) member 212.

The TMR element 200 is connected to the corresponding write bit and word lines 208 and 210 at its both ends, respectively, to form a simple matrix structure, as shown in FIG. 6, in which the TMR element 200 is directly interposed between the write bit and word lines 208 and 210.

The write bit and word lines 208 and 210 are used for data writing/retrieving in/from a TMR element of a selected memory cell. The inversion-assist member 212 amplifies magnetic fields applied through the write word line 208 to assist in inversion of the magnetization direction in a storage layer 206 of the TMR element 200.

Like the TMR element 100 in the first embodiment, the TMR element 200 is equipped with a Ta-made buffer layer; an Ir—Mn-made antiferromagnetic layer; a Co—Fe-made magnetization-reference layer; an $Al_2O_3$-made tunnel-barrier layer; and the Co—Fe—Ni-made storage layer 206.

The direction of easy axis of magnetization in the storage layer 206 will be almost parallel to the magnetization direction in the magnetization-reference layer.

The TMR element 200 is a square element of 100 nm in both cell width and cell length. The area of each cell memory is $4F^2$, as shown in FIG. 6, in which "F" is a dimension under the design rule.

The quasi-semicircular member 209 is a cut-away member provided around the write bit line 208 via an insulating film. In detail, the member 209 is provided at its both ends, as shown in FIG. 5B, in the direction of easy axis of magnetization in the storage layer 206, for flux circulation from the layer 206.

The inversion-assist member 212 is also a cut-away member provided around the write word line 210 via an insulating film. In detail, the assist member 212 is provided at its both ends, as shown in FIG. 5B, in the direction of hard axis of magnetization in the storage layer 206, to amplify magnetic fields applied through the word line 210 in this direction.

The quasi-semicircular member 209 and also the inversion-assist member 212 are made of a highly permeable magnetic material.

It is known that a highly permeable magnetic-material member situated in the direction of hard axis of magnetization in a storage layer of a TMR element for assisting in inversion of the magnetization direction in this layer will reduce magnetic anisotropic energy in this axis direction. The reduction of magnetic anisotropic energy will further cause magnetization-direction instability in the storage layer.

In order to overcome such problems, the quasi-semicircular member 209 and the inversion-assist member 212 are arranged in the vicinity of the storage layer 206, as shown in FIG. 5B. This arrangement reduces magnetic anisotropic energy in the direction of easy axis of magnetization much more than in the direction of hard axis of magnetization, in the second embodiment.

In detail, the quasi-semicircular member 209 and the inversion-assist member 212 are arranged such that the distance $d_e$ from an end of the member 209 situated in the direction of easy axis of magnetization to the storage layer 206 is shorter than the distance $d_h$ from an end of the member 212 situated in the direction of hard axis of magnetization to the layer 206.

The distance $d_h$ (preferably, shorter than 50 nm) 1.1 times or more longer than the distance $d_e$ will enhance the advantages discussed above. The distance $d_h$ two times or more longer than the distance $d_e$ is, however, a recommended specification in practical use.

Moreover, a highly permeable magnetic material that exhibits permeability three times higher than the material for the inversion-assist member 212 may be selected for the quasi-semicircular member 209, for further reduction of magnetic anisotropic energy in the direction of hard axis of magnetization.

The quasi-semicircular member 209 may be elongated in the direction of the storage layer 206 of the TMR element 200, at both ends of the member 209 on both sides of the bit line 208 whereas the rotation-assist member 212 is not allowed be elongated to the layer 206 at both ends of the member 212 on both sides of the word line 210.

The arrangement allows that the distance $d_e$ from an end of the quasi-semicircular member 209 situated in the direction of easy axis of magnetization to the storage layer 206 is shorter than the distance $d_h$ from an end of the inversion-assist member 212 situated in the direction of hard axis of magnetization to the layer 206.

In accordance with this arrangement, the inversion-assist member 212 is provided under the TMR element 200 whereas the quasi-semicircular member 209 is provided over the element 200, in the second embodiment, which offers easy magnetic-memory production even with a general production process.

The quasi-semicircular member 209 is made of $Ni_{78}Fe_{22}$ whereas the inversion-assist member 212 is made of $Ni_{45}Fe_{55}$. In detail, the member 109 is made of a material containing a ferromagnetic material, which is an alloy including at least one of the metals Co, Fe and Ni, exhibiting specific permeability of more than 10.

Any one of the several modifications to the quasi-semicircular member 109 in the first embodiment, shown in GIGS. 2A to 2D, can also be applied to the quasi-semicircular member 209 and the inversion-assist member 212 in the second embodiment.

As disclosed above, like the first embodiment, the second embodiment also offers enhanced data-holding stability in the storage layer of a TMR element used for memory cells, and thus providing a highly reliable magnetic memory.

The second embodiment described above has two requirements: difference in distance $d_e < d_h$; and a permeable magnetic material for the quasi-semicircular member 209 that exhibits permeability higher than that for the inversion-assist member 212.

What is indispensable in the second embodiment is, however, that magnetic anisotropic energy in the direction of easy axis of magnetization be smaller than that in the direction of hard axis of magnetization. This energy requirement is met by, for example, choosing a permeable magnetic material for the quasi-semicircular member 209 exhibiting permeability ten times higher than that for the inversion-assist member 212, even though the distance $d_e$ is two times longer than the distance $d_h$.

Magnetic anisotropic energy is almost proportional to the permeability of a highly permeable magnetic member situated in the direction of magnetization but inverse proportional to the distance between the magnetic member and the storage layer.

The quasi-semicircular member 209 and the inversion-assist member 212 intersect the plane of the storage layer 206 in this embodiment, which is, however, not a must.

The second embodiment is provided with the quasi-semicircular member 209 and the inversion-assist member 212 around the write wirings 208 and 210 via an insulating film (not shown). Such insulating film is, however, not a must while resistivity of the members 209 and 212 is preferably higher (at least two times) than the wirings 208 and 210, preferably with barrier metal interposed between the members 209 and 212 and the wirings 208 and 210. The barrier metal may be of Co—Fe, TiN, TaN or TiW for the members 209 and 212 made of Ni—Fe.

The first and the second embodiments allow magnetization appearing at both ends of the quasi-semicircular member 109 or 209, in the same direction as magnetic flux in the flux closed loop.

Moreover, a synthetic structure, for the magnetic-reference layer, having a non-ferromagnetic layer interposed between two ferromagnetic layers in antiferromagnetic coupling, can reduce magnetic coupling from the reference layer, thus promoting the advantages discussed in the first and the second embodiments.

The quasi-semicircular member may have a shape elongating to the direction of its thickness (the direction perpendicular to the magnetic-flux closed loop), that is, a cylinder-type structure, which can be shared by adjacent storage cells.

The quasi-semicircular member 209 in the second embodiment is preferably made of a highly permeable magnetic material, such as, Fe, Fe—Al alloy, Fe—Si alloy, Fe—Si—Al alloy (sendust), NiFe alloy or soft ferrite mainly containing $Fe_2O_3$ alloy, or amorphous alloy of Fe, Co or Ni, and B, Si or P.

The inversion-assist member 212 in the second embodiment is preferably made of a highly permeable magnetic material including Ni, Fe or Co.

The first and the second embodiments employ a single-tunnel-junction TMR element having a magnetization-reference layer, a tunnel-barrier layer and a storage layer for the memory cells. Not only that, however, a double (or more)-tunnel-junction TMR element, which comprises a first magnetization-reference layer, a first tunnel-barrier layer, a storage layer, a second tunnel-barrier layer and a second magnetization-reference layer, can offer the advantages the same as discussed in the embodiments.

As disclosed above, the present invention achieves enhanced data-holding stability in the storage layer of a TMR element used for memory cells, and thus providing a highly reliable magnetic memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magnetic memory comprising:
   a first wiring;
   a second wiring intersecting the first wiring; and
   a memory cell provided in an intersection area of the first and second wirings, the memory cell including,
   a magnetoresistive effect element having a storage layer in which data is stored by magnetic fields generated when current flows via the first and second wirings,
   a first magnetic member partially surrounding the first wiring and having two ends, the two ends being situated in a direction of easy axis of magnetization of the storage layer, and
   a second magnetic member partially surrounding the second wiring and having two ends, the two ends being situated in a direction of hard axis of magnetization of the storage layer, wherein each end of the first magnetic member is closer to the storage layer than each end of the second magnetic member.

2. The magnetic memory according to claim 1, wherein the first magnetic member is made of a material containing a ferromagnetic material exhibiting specific permeability of more than 10.

3. The magnetic memory according to claim 1, wherein the magnetoresistive effect element comprises a magnetization-reference layer, a tunnel-barrier layer, and the storage layer, or the magnetoresistive effect element comprises a first magnetization-reference layer, a first tunnel-barrier layer, a storage layer, a second tunnel-barrier layer, and a second magnetization-reference layer.

4. The magnetic memory according to claim 1, wherein the magnetoresistive effect element further comprises a magnetization-reference layer, and the two ends of the first magnetic member are situated in a direction of magnetization in the magnetization-reference layer.

5. The magnetic memory according to claim 1, wherein a distance between each of the two ends of the second magnetic member and the storage layer is at least 10% longer than a distance between each of the two ends of the first magnetic member and the storage layer.

6. The magnetic memory according to claim 1, wherein a distance between each of the two ends of the second magnetic member and the storage layer is at least two times longer than a distance between each of the two ends of the first magnetic member and the storage layer.

7. The magnetic memory according to claim 5, wherein the distance between each of the two ends of the second magnetic member and the storage layer is shorter than 50 nm.

8. The magnetic memory according to claim 1, wherein each of the two ends of the first magnetic member has a portion extending toward the magnetoresistive effect element.

9. The magnetic memory according to claim 1, wherein the two ends of the first magnetic member are elongated, on both sides of the first wiring, toward the storage layer of the magnetoresistive effect element.

10. The magnetic memory according to claim 1, wherein the two ends of the first magnetic member are elongated, on both sides of the first wiring, toward the storage layer of the magnetoresistive effect element, and the two ends of the second magnetic member are elongated, on both sides of the second wiring, toward the storage layer of the magnetoresistive effect element.

11. A magnetic memory comprising:

a first wiring;

a second wiring intersecting the first wiring; and a memory cell provided in an intersection area of the first and second wirings, the memory cell including, a magnetoresistive effect element having a storage layer in which data is stored by magnetic fields generated when current flows via the first and second wirings, a first magnetic member partially surrounding the first wiring and having two ends, the two ends being situated in a direction of easy axis of magnetization of the storage layer, and a second magnetic member partially surrounding the second wiring and having two ends, the two ends being situated in a direction of hard axis of magnetization of the storage layer, wherein the first magnetic member is made of a material exhibiting permeability higher than the second magnetic member.

12. The magnetic memory according to claim 11, wherein the first magnetic member is made of a material containing a ferromagnetic material exhibiting specific permeability of more than 10.

13. The magnetic memory according to claim 11, wherein the magnetoresistive effect element comprises a magnetization-reference layer, a tunnel-barrier layer, and the storage layer, or the magnetoresistive effect element comprises a first magnetization-reference layer, a first tunnel-barrier layer, a storage layer, a second tunnel-barrier layer, and a second magnetization-reference layer.

14. The magnetic memory according to claim 11, wherein the magnetoresistive effect element further comprises a magnetization-reference layer, and the two ends of the first magnetic member are situated in a direction of magnetization in the magnetization-reference layer.

15. The magnetic memory according to claim 11, wherein each of the two ends of the first magnetic member has a portion extending toward the magnetoresistive effect element.

16. A magnetic memory comprising:

a first wiring;

a second wiring intersecting the first wiring; and a memory cell provided in an intersection area of the first and second wirings, the memory cell including, a magnetoresistive effect element having a storage layer in which data is stored by magnetic fields generated when current flows via the first and second wirings, a first magnetic member partially surrounding the first wiring and having two ends, the two ends being situated in a direction of easy axis of magnetization of the storage layer, and a second magnetic member partially surrounding the second wiring and having two ends, the two ends being situated in a direction of hard axis of magnetization of the storage layer, wherein each of the first and second magnetic members is made of a material containing a ferromagnetic material, and the two ends of the first magnetic member are elongated, on both sides of the first wiring, toward the storage layer of the magnetoresistive effect element, such that the elongated two ends of the first magnetic member are situated closer to the storage layer than the two ends of the second magnetic member.

17. The magnetic memory according to claim 16, wherein the magnetoresistive effect element comprises a magnetization-reference layer, a tunnel-barrier layer, and the storage layer, or the magnetoresistive effect element comprises a first magnetization-reference layer, a first tunnel-barrier layer, a storage layer, a second tunnel-barrier layer, and a second magnetization-reference layer.

18. The magnetic memory according to claim 16, wherein the magnetoresistive effect element further comprises a magnetization-reference layer, and the two ends of the first magnetic member are situated in a direction of magnetization in the magnetization-reference layer.

19. The magnetic memory according to claim 16, wherein a distance between each of the two ends of the second magnetic member and the storage layer is at least 10% longer than a distance between each of the two ends of the first magnetic member and the storage layer.

20. The magnetic memory according to claim 19, wherein the distance between each of the two ends of the second magnetic member and the storage layer is shorter than 50 nm.

21. The magnetic memory according to claim 16, wherein each of the two ends of the first magnetic member has a portion extending toward the magnetoresistive effect element.

22. The magnetic memory according to claim 16, wherein the first magnetic member is provided over the magnetoresistive effect element, and the second magnetic member is provided under the magnetoresistive effect element.

23. A magnetic memory comprising:

a first wiring;

a second wiring intersecting the first wiring; and a memory cell provided in an intersection area of the first and second wirings, the memory cell including, a magnetoresistive effect element having a storage layer in which data is stored by magnetic fields generated when current flows via the first and second wirings, a first electrode electrically connected to one of two ends of the magnetoresistive effect element and electrically connected to the first wiring, a second electrode electrically connected to another of the two ends of the magnetoresistive effect element, and a magnetic member partially surrounding the storage layer and having two ends, the two ends being situated along a direction of easy axis of magnetization of the storage layer.

24. The magnetic memory according to claim 23, further comprising a contact plug having two ends, one of the two ends of the contact plug being connected to the second electrode and the other being connected to a selection transistor.

25. The magnetic memory according to claim 23, wherein the magnetic member includes first and second sub-members configured to receive and send magnetic fluxes from and to the storage layer, and a third sub-member configured to connect the first and second sub-members.

26. The magnetic memory according to claim 23, wherein the magnetic member has a cross-section shape selected from the group consisting of an angled "C"-shape, an angled "C"-shape with ends elongating inside, a horseshoe-like shape, a horseshoe-like shape with an end elongating inside, a character-"U"-like shape, a character-"U"-like shape with ends elongating inside, a character-"C"-like shape, and a character-"C"-like shape with ends elongating inside.

27. The magnetic memory according to claim 23, wherein the magnetic member partially surrounds the storage layer in a direction parallel to a surface of the storage layer.

* * * * *